(12) United States Patent
Lee

(10) Patent No.: US 7,488,645 B2
(45) Date of Patent: Feb. 10, 2009

(54) METHOD OF FABRICATING A NON-VOLATILE MEMORY

(75) Inventor: Tzyh-Cheang Lee, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 544 days.

(21) Appl. No.: 10/907,707

(22) Filed: Apr. 13, 2005

(65) Prior Publication Data
US 2006/0234452 A1   Oct. 19, 2006

(51) Int. Cl.
*H01L 21/336* (2006.01)

(52) U.S. Cl. .................. 438/257; 438/261; 438/287; 438/288

(58) Field of Classification Search .............. None
See application file for complete search history.

(56) References Cited

U.S. PATENT DOCUMENTS 6,194,784 B1 * 2/2001 Parat et al. ............... 257/774
6,713,350 B2 * 3/2004 Rudeck ..................... 438/261
6,955,965 B1 * 10/2005 Halliyal et al. ............ 438/257

* cited by examiner

*Primary Examiner*—Zandra Smith
*Assistant Examiner*—Khanh B Duong
(74) *Attorney, Agent, or Firm*—Jianq Chyun IP Office

(57) ABSTRACT

A non-volatile memory and a method of fabricating the same are described. First, a substrate is provided. Then, a plurality of stack structures is formed on the substrate. Each stack structure comprises, from bottom to top, a bottom dielectric layer, a charge trapping layer, a top dielectric layer, a control gate and a cap layer. Next, a plurality of spacers is formed on the sidewalls of the stack structures. Thereafter, a gate dielectric layer is formed over the substrate. A word line is formed between two neighboring stack structures. After that, the cap layers in the stack structures are removed. A source and a drain are formed in the substrate beside the stack structures adjacent to the sides of each word line.

10 Claims, 3 Drawing Sheets

METHOD OF FABRICATING A NON-VOLATILE MEMORY

BACKGROUND OF THE INVENTION

1. Field of the Invention

The present invention relates to a non-volatile memory and fabricating method thereof. More particularly, the present invention relates to a non-volatile memory and fabricating method thereof that can improve the electrical properties and the reliability of the memory device.

2. Description of the Related Art

At present, one of the most common types of non-volatile memory is an electrically erasable programmable read-only-memory (EEPROM) called the 'flash memory'. Flash memory allows multiple data writing, reading and erasing operations. Furthermore, the stored data will be retained even after power to the device is removed. With these advantages, flash memory has become one of the most widely adopted non-volatile memories for personal computer and electronic equipment.

A typical flash memory has a floating gate and a control gate fabricated using doped polysilicon. In the process of programming data into a flash memory cell, the electrons injected into the floating gate will distribute evenly throughout the entire doped polysilicon floating gate layer. However, if the tunneling oxide layer underneath the doped polysilicon floating gate has some defects, a leakage current may flow from the device and lead to a drop in the overall reliability of the device.

To resolve the aforementioned leakage problem in the flash memory, a non-volatile memory having a charge trapping layer instead of the doped polysilicon floating gate called a silicon-oxide-nitride-oxide-semiconductor (SONOS) has been developed. Because a SONOS memory has an oxide-nitride-oxide (ONO) composite dielectric layer structure, the nitride layer can serve as a trapping layer for electrons. In general, programming can be achieved by injecting channel hot electrons (CHE) from the bottom oxide layer of the oxide-nitride-oxide (ONO) composite dielectric layer structure. Conversely, to erase stored data within the memory device, tunneling enhanced hot holes (TEHH) can be injected through the bottom oxide layer of the oxide-nitride-oxide (ONO) composite dielectric layer structure. Thus, the SONOS memory is one important type of device that can combat leakage problems. However, as the dimension of devices continues to decrease, errors resulting from charge migration in the charge trapping layer inside the aforementioned SONOS memory occurs more frequently.

In recent years, a type of memory with charge trapping occurring in the oxide-nitride-oxide dielectric structure (shown in FIG. 1) on each side of the gate has been developed. FIG. 1 is a schematic cross-sectional view of a conventional non-volatile memory. As shown in FIG. 1, the word line 120 of the silicon-oxide-nitride-oxide-semiconductor (SONOS) memory is formed on a gate oxide layer 110 above the substrate 100. The control gates 170 are formed on the sidewalls of the word line 120 and are shaped like a spacer. The word line 120 and the control gate 170 as well as the control gate 170 and the substrate 100 are separated from each other by an oxide-nitride-oxide (ONO) composite structure comprising a bottom dielectric layer 140, a charge trapping layer 150 and a dielectric cap layer 160. The source 180 and the drain 190 are formed in the substrate 100 beside the control gate spacer 170 on each side of the word line 120.

In the process of programming the device, because the charges are trapped inside the charge trapping layer 150 on each side of the word line 120, charge migration problem due to device miniaturization can be avoided. However, electric charges trapped inside the oxide-nitride-oxide (ONO) structures on the sidewalls of the word line within the SONOS non-volatile memory are difficult to remove. Hence, charges will accumulate and ultimately will lead to device reliability problems.

On the other hand, because the control gate is shaped like a spacer, the control gate has an arc surface instead of a plane surface. In the subsequent process of fabricating a contact, a good electrical connection between the contact and the control gate spacer is difficult.

In addition, the etching back operation used in the process of forming the control gate spacers may damage the oxide-nitride-oxide (ONO) structure. Therefore, a short circuit is easily formed when a silicide layer is subsequently formed between the word line and the control gate spacers.

SUMMARY OF THE INVENTION

Accordingly, at least one objective of the present invention is to provide a non-volatile memory for improving the reliability of a memory device.

At least a second objective of the present invention is to provide a method of fabricating a non-volatile memory that can improve the electrical properties of a memory device.

To achieve these and other advantages and in accordance with the purpose of the invention, as embodied and broadly described herein, the invention provides a method of fabricating a non-volatile memory. First, a substrate is provided. Then, a plurality of stack structures is formed on the substrate. Each stack structure comprises, from bottom to top, a bottom dielectric layer, a charge trapping layer, a top dielectric layer, a control gate layer and a cap layer. Thereafter, a plurality of spacers is formed on the sidewalls of the stack structures. A gate dielectric layer is formed over the substrate. Next, a word line is formed between two neighboring stack structures. After that, the cap layers in the stack structures are removed. A source and a drain are formed in the substrate beside the stack structures adjacent to the sides of each word line.

According to one preferred embodiment of the present invention, the method of forming the spacers in the process of fabricating the non-volatile memory includes forming a spacer material layer over the substrate to cover the stack structures. Thereafter, the spacer material layer is etched back to form the spacers on the sidewall of the stack structures.

According to one preferred embodiment of the present invention, the method of forming the gate dielectric layer in the process of fabricating the non-volatile memory includes performing a thermal oxidation process.

According to one preferred embodiment of the present invention, the method of forming the word line between two neighboring stack structures includes forming a conductive layer over the substrate to cover the stack structures and fill the space between two neighboring stack structures. Thereafter, a portion of the conductive layer is removed to expose the cap layer of various stack structures. Than, a patterned photoresist layer is formed over the substrate to cover the conductive layer between two stack structures and expose at least a portion of the cap layer. After that, using the patterned photoresist layer as a mask, the cap layers of the stack structures are removed. Finally, the patterned photoresist layer is removed.

According to one preferred embodiment of the present invention, the method of removing a portion of the conductive layer to expose the cap layer of various stack structures includes performing a chemical-mechanical polishing process using the cap layers of the stack structures as a polishing stop layer.

According to one preferred embodiment of the present invention, the method of removing a portion of the conductive layer to expose the cap layer of various stack structures includes performing an etching back operation using the cap layer of various stack structures as an etching stop layer.

According to one preferred embodiment of the present invention, the method of removing the cap layer of various stack structures includes performing a wet etching operation.

According to one preferred embodiment of the present invention, the method of forming a source region and a drain region in the substrate includes performing an ion implantation process.

The present invention also provides a non-volatile memory comprising a substrate, a plurality of stack structures, a plurality of word lines, a plurality of spacers, a gate dielectric layer, a plurality of source regions and a plurality of drain regions. The stack structures are disposed on the substrate. Each stack structure comprises a bottom dielectric layer, a charge trapping layer, a top dielectric layer and a control gate. In each stack structure, the bottom dielectric layer is disposed on the substrate; the charge trapping layer is disposed on the bottom dielectric layer; the top dielectric layer is disposed on the charge trapping layer and the control gate is disposed on the top dielectric layer. In addition, the word lines are disposed on the substrate between every pair of neighboring stack structures. The spacers are disposed between the stack structures and their corresponding word line. The gate dielectric layer is disposed between the word line and the substrate. The source regions and the drain regions are disposed in the substrate beside the various stack structures on each side of the word lines.

According to one preferred embodiment of the present invention, the control gate of the non-volatile memory has a planar top surface.

In the non-volatile memory of the present invention, there is no oxide-nitride-oxide structure on the sidewalls of the word lines as in the conventional silicon-oxide-nitride-oxide-semiconductor (SONOS) memory structure. Hence, there is no need to worry about charges trapping in the oxide-nitride-oxide structure next to the sidewalls of the word line. In other words, overall reliability of the memory device is improved.

In addition, the control gate of the non-volatile memory of the present invention has a planar top surface. Therefore, it is much easier to form an electrical connection between the control gate and a contact in a subsequent contact fabrication process.

On the other hand, according to the method of fabricating the non-volatile memory in the present invention, the formation of spacers between the word lines and the control gates is able to provide an effective insulation that prevents any short-circuiting after a subsequent silicide fabrication process. Hence, electrical properties of the memory device are improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
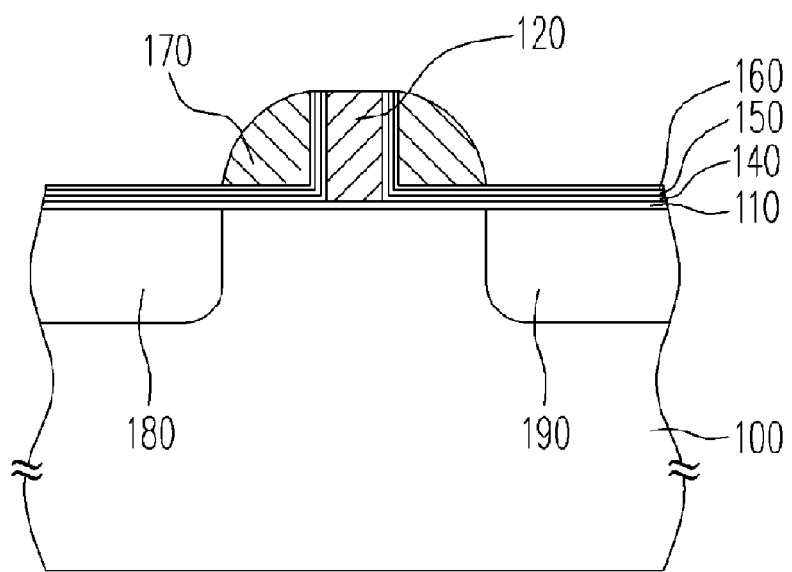
FIG. 1 is a schematic cross-sectional view of a conventional non-volatile memory.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
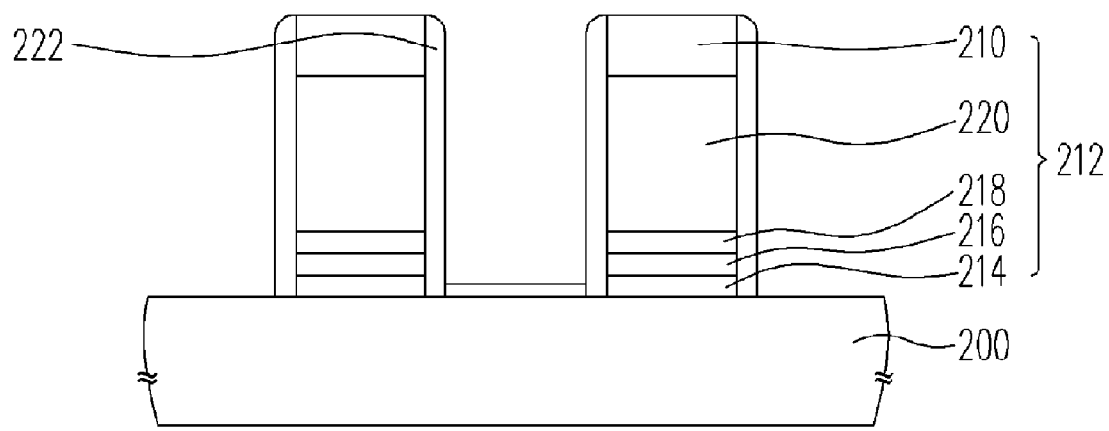
FIGS. 2A through 2C are schematic cross-sectional views showing the steps for fabricating a non-volatile memory according to one preferred embodiment of the present invention.
Figure 2B:
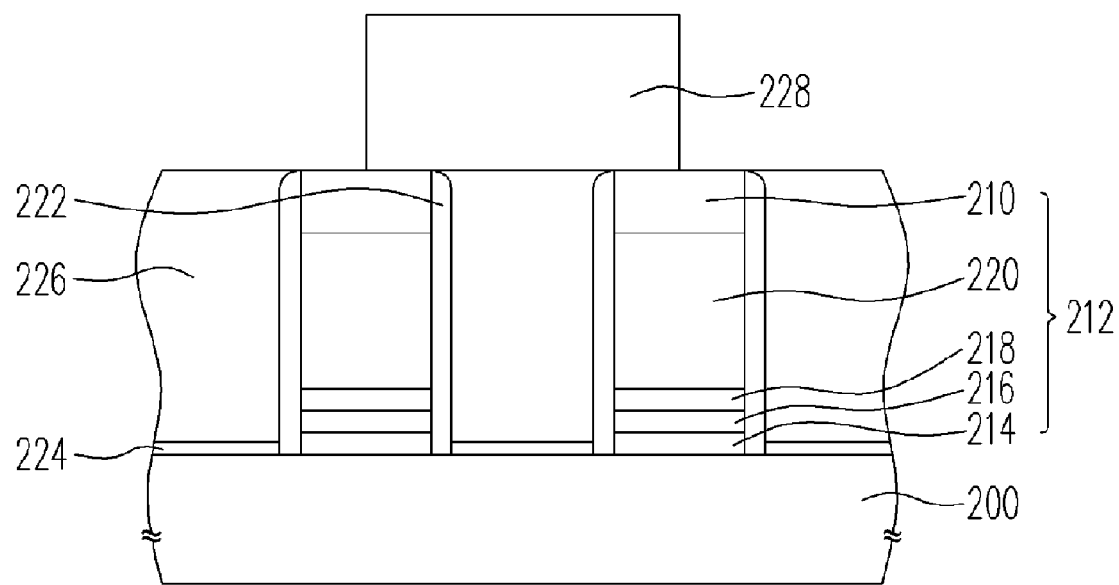
Figure 2C:
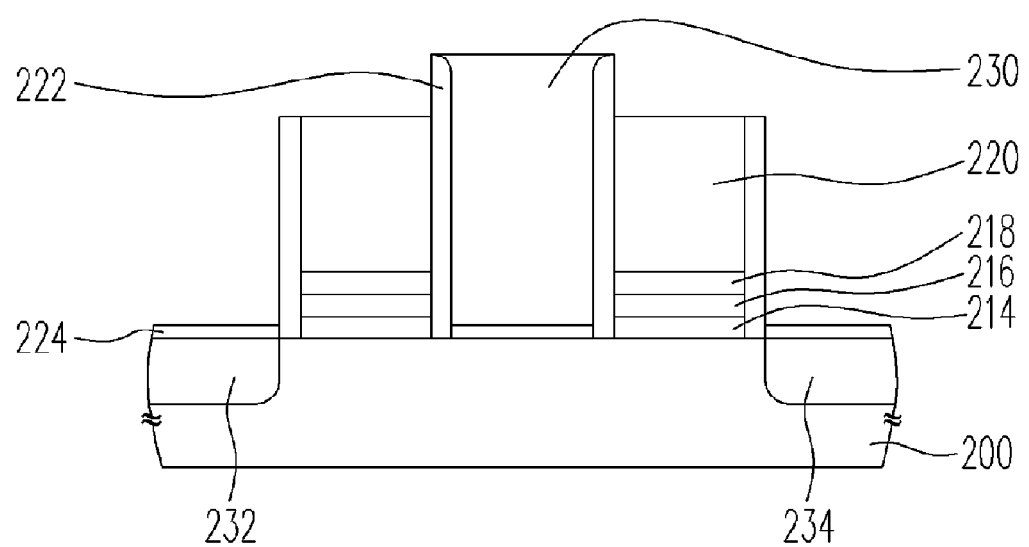

FIGS. 2A through 2C are schematic cross-sectional views showing the steps for fabricating a non-volatile memory according to one embodiment of the present invention. As shown in FIG. 2A, a semiconductor substrate 200 is provided. Next, a plurality of stack structures 212 is formed over the substrate 200. Each stack structure 212 comprises, from bottom to top, a bottom dielectric layer 214, a charge trapping layer 216, a top dielectric layer 218, a control gate 220 and a cap layer 210. The stack structures 212 are formed, for example, by sequentially forming a bottom dielectric layer 214, a charge-trapping material layer 216, a top dielectric material layer 218, a control gate layer 220 and a cap layer 210 over the substrate 200 and patterning the aforementioned layers. Since the materials, the steps and other operating parameters related to the fabrication of the stack structures should be familiar to the ones skilled in the art of semiconductor fabrication, a detailed description is omitted here.

Thereafter, as shown in FIG. 2A, a plurality of spacers 222 is formed on the respective sidewalls of each stack structure 212. The spacers 222 are silicon nitride or silicon oxide layer formed, for example, by depositing spacer material (not shown) over the semiconductor substrate 200 to cover the stack structures 212 and then etching back the spacer material layer.

As shown in FIG. 2B, a gate dielectric layer 224 is formed over the semiconductor substrate 200. The gate dielectric layer 224 is a silicon oxide layer formed, for example, by performing a thermal oxidation process. Thereafter, a conductive layer 226 is formed over the semiconductor substrate 200 to cover the stack structures 212 and fill up the space between neighboring two stack structures 212. The conductive layer 226 is a doped polysilicon layer formed by performing a chemical vapor deposition (CVD) process, for example. After that, a portion of the conductive layer 226 is removed to expose the cap layer 210 of various stack structures 212. The method of removing a portion of the conductive layer 226 includes performing a chemical-mechanical polishing operation using the cap layer 210 of various stack structures 212 as a polishing stop layer. In another preferred embodiment, the method of removing a portion of the conductive layer 226 to expose the cap layer 210 of various stack structures 212 includes etching back the conductive layer 226 using the cap layer 210 of various stack structures 212 as an etching stop layer. Next, a patterned photoresist layer 228 is formed over the substrate 200 to cover the conductive layer 226 between two stack structures 212 so that at least a portion of the cap layer 210 is exposed.

As shown in FIG. 2C, the cap layer 210 of the stack structures 212 and the conductive layer 226 not covered by the photoresist layer 228 are removed. The method of removing the cap layer 210 and the exposed conductive layer 226 includes performing a wet etching operation using the photoresist layer 228 as a mask so that a word line 230 is formed between two neighboring stack structures 212.

Thereafter, as shown in FIG. 2C, the photoresist layer 228 is removed and then a source region 232 and a drain region 234 are formed in the semiconductor substrate 200 beside the stack structures 212 on each side of the word line 230. The method of forming the source region 232 and the drain region 234 includes performing an ion implantation process, for example.

In the aforementioned method of forming the non-volatile memory, the spacers 222 between the control gate 220 and the word line 230 has a better quality. Hence, in a subsequent process of forming a silicide layer (not shown), short-circuiting phenomenon rarely occurs. In other words, the electrical properties of the non-volatile memory are improved.

Since subsequent processes for producing a complete non-volatile memory should be familiar to everyone knowledgeable about memory fabrication, a detailed description of those steps is omitted.

Figure 3:
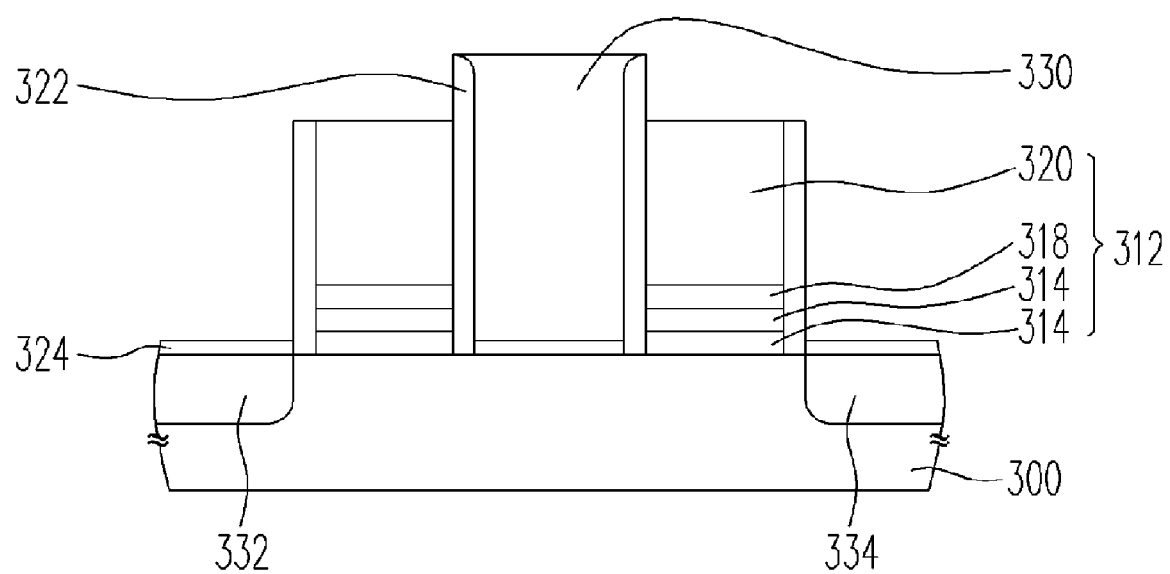
FIG. 3 is a schematic cross-sectional view of a non-volatile memory according to one preferred embodiment of the present invention.

In the following, the structure of a non-volatile memory fabricated using the aforementioned method is described with reference to FIG. 3. FIG. 3 is a schematic cross-sectional view of a non-volatile memory according to one embodiment of the present invention. As shown in FIG. 3, the non-volatile memory mainly comprises a semiconductor substrate 300, a plurality of stack structures 312, a plurality of spacers 322, a gate dielectric layer 324, a word line 330, a source region 332 and a drain region 334. The plurality of stack structures 312 is disposed on the semiconductor substrate 300. Each stack structure 312 comprises a bottom dielectric layer 314, a charge trapping layer 316, a top dielectric layer 318 and a control gate 320.

The bottom dielectric layer 314 is disposed on the semiconductor substrate 300. The bottom dielectric layer 314 is fabricated using a non-conductive material including silicon oxide, for example. The charge-trapping layer 316 is disposed on the bottom oxide layer 314. The charge-trapping layer 316 is fabricated using a non-conductive material including silicon nitride, for example. The top dielectric layer 318 is disposed on the charge-trapping layer 316. The top dielectric layer 318 is fabricated using a non-conductive material including silicon oxide, for example. The control gate 320 is disposed on the top dielectric layer 318 and has a planar surface, for example. The control gate 320 is fabricated using a conductive material including doped polysilicon, for example.

Furthermore, the word line 330 is disposed on the semiconductor substrate 300 and located between two neighboring stack structures 312. The word line 330 is fabricated using doped polysilicon, for example. The spacers 322 are disposed between the stack structures 312 and their corresponding word lines 330. The spacers 322 are fabricated using a non-conductive material including silicon nitride or silicon oxide, for example. The gate dielectric layer 324 is disposed between the word line 330 and the semiconductor substrate 300. The gate dielectric layer 324 is fabricated using silicon oxide, for example. The source region 332 and the drain region 334 are disposed in the semiconductor substrate 300 beside the stack structures 312 on each side of the word line 330.

In the non-volatile memory of the present invention, there is no oxide-nitride-oxide structure on the sidewalls of the word lines 330 as in the conventional silicon-oxide-nitride-oxide-semiconductor (SONOS) memory structure. Hence, there is no need to worry about charges trapping in the oxide-nitride-oxide structure next to the sidewalls of the word lines 330. In other words, overall reliability of the memory device is improved. In addition, the control gate 320 of the non-volatile memory of the present invention has a planar top surface with a rectangular outline. Therefore, it is much easier to form an electrical connection between the control gate 320 and a contact in a subsequent contact fabrication process.

In summary, the advantages of the present invention includes as follows.

1. The non-volatile memory in the present invention is able to resolve the problem of electric charges trapped in the oxide-nitride-oxide structure on the sidewalls of the word line in the conventional technique. Hence, the overall reliability of the memory device is improved.

2. The control gate has a planar top surface so that the process of forming an electrical connection between the control gate and a contact is very much facilitated.

3. The spacers between the word lines and the control gates have a better quality so that the chance of short-circuiting after forming a silicide layer is reduced. Thus, the electrical properties of the memory device are improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a non-volatile memory, comprising the steps of:
    providing a substrate;
    forming a plurality of stack structures on the substrate with each stack structure comprising, from bottom to top, a bottom dielectric layer, a charge trapping layer, a top dielectric layer, a control gate and a cap layer;
    forming a plurality of spacers on each sidewall of the stack structures;
    forming a gate dielectric layer over the substrate;
    forming a word line between two neighboring stack structures;
    removing the cap layer of the stack structures; and
    forming a source region and a drain region in the substrate beside the stack structures on each side of the word line.

2. The method of claim 1, wherein the steps for forming the word line between the two neighboring stack structures comprise:
    forming a conductive layer over the substrate to cover the stack structures and fill up a space between the two neighboring stack structures;
    removing a portion of the conductive layer to expose the cap layer of the stack structures;
    forming a patterned photoresist layer over the substrate to cover the conductive layer between two neighboring stack structures so that at least a portion of the cap layer is exposed;
    removing the cap layer of the stack structures using the patterned photoresist layer as a mask; and
    removing the patterned photoresist layer.

3. The method of claim 2, wherein the step for removing the portion of the conductive layer to expose the cap layer of the stack structures comprises performing a chemical-mechanical polishing operation using the cap layer of the stack structures as a polishing stop layer.

4. The method of claim 2, wherein die step for removing the portion of the conductive layer to expose the cap layer of the stack structures comprises performing an etching back process using the cap layer in the stack structures as an etching stop layer.

5. The method of claim 1, wherein the steps for forming the spacers comprise:
   forming a spacer material layer over the substrate to cover the stack structures; and
   etching back the spacer material layer to form spacers on the sidewalls of the stack structures.

6. The method of claim 1, wherein the step for forming the gate dielectric layer comprises performing a thermal oxidation process.

7. The method of claim 1, wherein the step for removing the cap layer of the stack structures comprises performing a wet etching process.

8. The method of claim 1, wherein the step for forming the source region and the drain region comprises performing an ion implantation process.

9. The method of claim 1, wherein a material constituting the cap layer of the stack structures comprises silicon nitride.

10. The method of claim 1, wherein a material constituting the spacers comprises silicon nitride or silicon oxide.

* * * * *